US005557219A

United States Patent [19]
Norwood et al.

[11] Patent Number: 5,557,219
[45] Date of Patent: Sep. 17, 1996

[54] INTERFACE LEVEL PROGRAMMABILITY

[75] Inventors: Roger D. Norwood, Stafford; Brian L. Brown, Missouri City, both of Tex.

[73] Assignee: Texas Instruments Incorporated, Dallas, Tex.

[21] Appl. No.: 456,436

[22] Filed: Jun. 1, 1995

Related U.S. Application Data

[62] Division of Ser. No. 189,466, Jan. 31, 1994, abandoned.

[51] Int. Cl.⁶ .............................. H03K 19/173
[52] U.S. Cl. .................. 326/49; 326/71; 326/58
[58] Field of Search ................ 326/49, 50, 58, 326/83, 70, 71, 73, 74

[56] References Cited

U.S. PATENT DOCUMENTS

| | | | |
|---|---|---|---|
| 4,350,906 | 9/1982 | Gillberg | 326/58 |
| 4,472,647 | 9/1984 | Allgood | 326/71 |
| 4,489,246 | 12/1984 | Nishiuchi | 307/448 |
| 4,789,966 | 12/1988 | Ozaki | 365/189 |
| 4,808,844 | 2/1989 | Ozaki et al. | 307/243 |
| 4,833,349 | 5/1989 | Liu et al. | 326/58 |
| 4,853,560 | 8/1989 | Iwamura et al. | |
| 4,990,800 | 2/1991 | Lee | 307/465 |
| 5,003,205 | 3/1991 | Kohda et al. | 326/58 |
| 5,023,488 | 6/1991 | Gunning | 307/475 |
| 5,023,843 | 6/1991 | Love | 365/222 |
| 5,057,712 | 10/1991 | Trinh | 307/465 |
| 5,099,143 | 3/1992 | Arakawa | 307/475 |
| 5,208,492 | 5/1993 | Masumoto | 326/58 |
| 5,260,612 | 11/1993 | Lehmann et al. | 307/475 |
| 5,303,180 | 4/1994 | McAdams | 365/63 |
| 5,304,872 | 4/1994 | Avraham et al. | 326/71 |

Primary Examiner—Edward P. Westin
Assistant Examiner—Andrew Sanders
Attorney, Agent, or Firm—Richard Havill; Rich Donaldson; Leo Heiting

[57] ABSTRACT

A system of interface circuits (15, 20-1 through 20-N) includes a mode sensing circuit (15) and one or more output circuits (20-1 through 20-N). The mode sensing circuit is arranged for producing control signals (on leads 22, 24) in response to an input signal (on lead 21). The output circuit (34-1) is arranged for producing an output data signal (DQ-1) dependent upon an input data signal (DATA) when the input signal (on lead 21) is in a first state and dependent upon the input data signal and the configuration of the connected output circuit (34-1) when the input signal is in a second state.

2 Claims, 2 Drawing Sheets

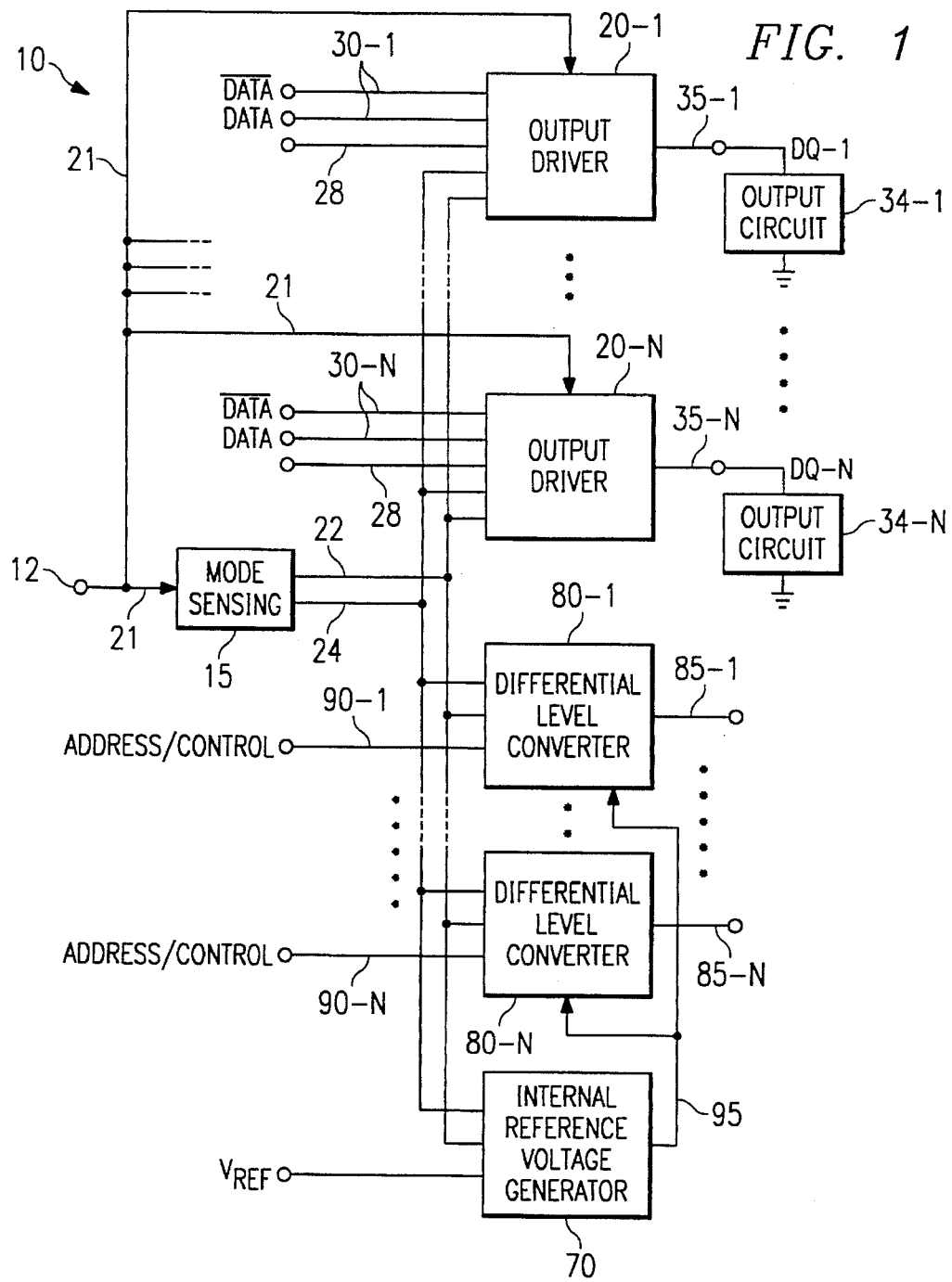
FIG. 1
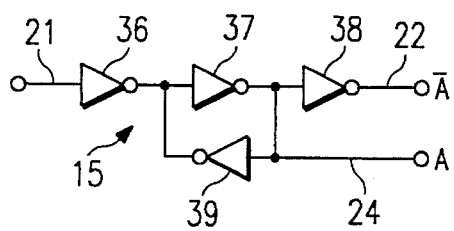
FIG. 2
| IN | OUT | |
|---|---|---|
| 21 | A | Ā |
| 1 | 1 | 0 |
| 0 | 0 | 1 |
FIG. 3

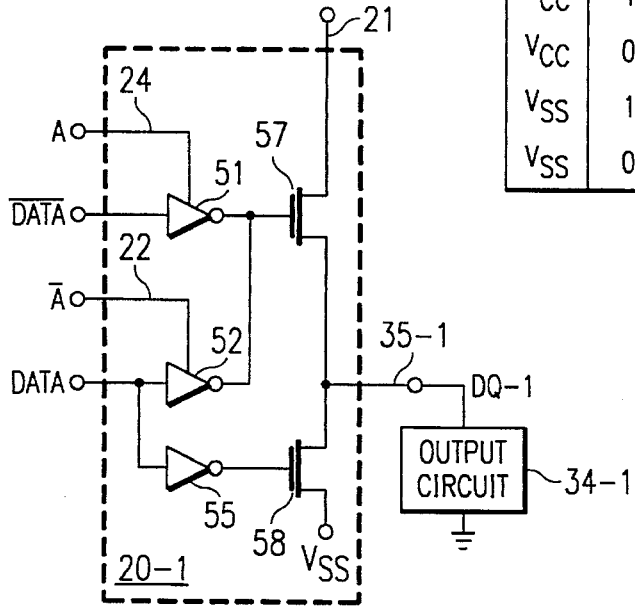
FIG. 4
| INPUT | | | | | OUTPUT DQ-1 |
|---|---|---|---|---|---|
| 21 | DATA | $\overline{\text{DATA}}$ | 24 | 22 | |
| $V_{CC}$ | 1 | 0 | 1 | 0 | 1 |
| $V_{CC}$ | 0 | 1 | 1 | 0 | 0 |
| $V_{SS}$ | 1 | 0 | 0 | 1 | DEPENDENT |
| $V_{SS}$ | 0 | 1 | 0 | 1 | 0 |
FIG. 5
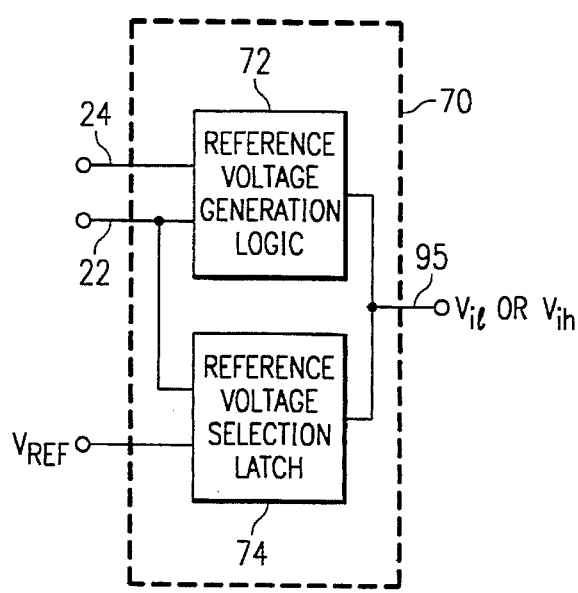
FIG. 6
| INPUTS | | INTERNAL ADDR/ CONT. 85-1 |
|---|---|---|
| $V_{il}/V_{ih}$ 95 | ADDR/CONT 90-1 | |
| 1 | 0 | 0 |
| 1 | 1 | 1 |
| 0 | 0 | 0 |
| 0 | 1 | 1 |
FIG. 7
| INPUTS | | FUNCTIONS | | |
|---|---|---|---|---|
| A | $\overline{A}$ | LOGIC 72 | LATCH 74 | LEAD 95 |
| 1 | 0 | ON | OFF | $V_{REF}$ 72 |
| 0 | 1 | OFF | ON | $V_{REF}$ EX |
FIG. 8

INTERFACE LEVEL PROGRAMMABILITY

This is a division of application Ser. No. 08/189,466, filed Jan. 31, 1994, now abandoned.

FIELD OF THE INVENTION

This invention relates to interface circuits and more particularly to an interface circuit for a digital integrated circuit.

BACKGROUND OF THE INVENTION

Manufacturers of integrated circuits desire to make any chip in a large volume. Customers, however, often desire slightly different versions of a circuit. The integrated circuit manufacturers have used circuit options to meet various customers' needs while allowing the manufacturer to produce a large volume of similar or nearly alike integrated circuits.

In recent years, two types of dynamic random access memories, DRAMs, are widely used. One type is operated in a page mode. The other is operated in a nibble mode. To achieve design and production efficiency, memory manufacturers make identical integrated circuit chips through most processing steps and customize them in a final metalization step for operation in either the page mode or the nibble mode. This final metalization step may utilize masks for forming specific interconnections or bonding pads that cause the integrated circuit chip to operate in the selected mode. This ultimately results in manufacture of two different parts requiring some different processing during manufacture and separate inventory control. The foregoing presents problems in the design, the manufacturing processes, and in inventory control. Because of those problems, there is a need for an integrated circuit arrangement which provides multiple options in the same identical integrated circuit device and package.

SUMMARY OF THE INVENTION

These problems are solved by a system of interface circuits including a mode sensing circuit and one or more output circuits. The mode sensing circuit is arranged for producing control signals in response to an input signal. The output circuit is arranged for producing an output data signal dependent upon an input data signal when the input signal is in a first state and dependent upon the input data signal and an output circuit connection when the input signal is in a second state.

Also a reference voltage generator includes a first circuit for producing a first voltage on a first output terminal and a second circuit for producing a second voltage on a second output terminal. The first and second output terminals are connected together, and the first and second circuits are enabled by first and second control signals which are complementary with respect to each other.

The implementation of this system of interface circuits simplifies the entire development process in a number of ways. First, there is an inventory and marketing advantage when a single device performs in two or more modes. Fewer different devices result in fewer device numbers and less time spent in marketing one device rather than in marketing two different devices. Fabrication planning and scheduling are simplified since only one device has to be manufactured. The manufacturing process does not have to be modified to fabricate slightly different devices. As a result, fabrication cycle time is reduced because one process can be run continuously without alteration. Also, there is an inherent reduction in total cost because only one mask set is used during manufacture, and only one type of device is manufactured.

BRIEF DESCRIPTION OF THE DRAWINGS

A better understanding of the invention can be derived by reading the following detailed description with reference to the drawings wherein:

FIG. 1 is a block diagram of an interface circuit system configuration;

FIG. 2 is a schematic diagram of a mode sense logic block shown in FIG. 1;

FIG. 3 is a truth table that represents the operation of the mode sense logic block of FIG. 2;

FIG. 4 is a schematic diagram of an output buffer/driver block shown in FIG. 1;

FIG. 5 is a truth table that represents the operation of the output buffer/driver block of FIG. 4;

FIG. 6 is a block diagram of an internal reference voltage generator block shown in FIG. 1;

FIG. 7 is a truth table that represents the operation of each differential level converter circuit shown in FIG. 1; and FIG. 8 is a truth table that represents the operation of the internal reference voltage generator circuit shown in FIGS. 1 and 6.

DETAILED DESCRIPTION

Referring now to FIG. 1, there is shown a block diagram of a system 10 of interface circuits which can be used in an integrated circuit device for providing different interface operations depending upon the state of an input signal and the configurations of different output circuits which can be connected to the outputs. An input terminal 12 is arranged for receiving the input signal, which may be at either one of two optional voltage levels $V_{cc}$ or $V_{ss}$. In FIG. 1, the voltage level applied on lead 12 may be any input signal whose state is supplied or controlled by a circuit or system external to the subject integrated circuit device. It is possible to extend this concept to any device or interface system having options determined by simple changes in the input signal states. For the example, as shown in FIG. 1, the interface system is configurable to operate in different modes based upon the level of the voltage applied to the input lead 12. It is noted, however, that a greater number of separate input signals may be used for other implementations which are not shown because they are considered to be straightforward. The optional voltage level applied to the input lead 12 is distributed to a mode sensing circuit 15 and one or more output driver circuits 20-1 through 20-N by way of leads 21. Only two output driver circuits are shown but others are represented by a series of dots shown between the output driver circuits 20-1 and 20-N and by multiple dashed leads connected to the lead 12. The mode sensing circuit 15 produces complementary interface control signals on control leads 22 and 24. The complementary interface control signals are applied to each of the output driver circuits 20-1 through 20-N to establish operating conditions for two different operating states, or modes, I and II.

Other control signals may be applied by way of leads 28 to the output driver circuits 20-1 through 20-N for the purposes of enabling or disabling operation of individual ones of the output driver circuits 20-1 through 20-N. These other control signals may or may not be useful or needed in any specific integrated circuit device. The control leads 28 are shown in FIG. 1 as an example of one option available to the system of interface circuits.

Separate complementary input data signals are applied to data leads 30-1 through 30-N of the output driver circuits 20-1 through 20-N. Output data signals are produced on output leads 35-1 through 35-N.

In response to the respective operating states I and II of the interface system, the output data signals depend upon either the input data signals on the leads 30-1 through 30-N or the input data signals and the configuration of connecting output circuits 34-1 through 34-N. The connecting output circuits, most likely, would be a terminating resistance network that is also connected to some voltage, e.g., $VV_{ss}$, $V_{cc}$ or an intermediate voltage therebetween. An alternative connecting output circuit is an open circuit with parasitic capacitance.

Referring now to FIG. 2, there is shown an exemplary logic schematic for the mode sensing circuit 15 of FIG. 1. Other mode sensing circuits can be used. They are considered to be obvious, known circuits. This mode sensing circuit 15 of FIG. 2 automatically determines which of the two operating modes, or states, I or II is to be used. There are three inverters 36, 37 20 and 38 connected in a series aiding circuit between the input lead 21 and the complementary control lead 22. Two of those inverters 36, 37 also are located between the input lead 21 and the control lead 24. A fourth inverter 39 is connected to feedback around the inverter 37 to create a hysteresis loop. When a high level voltage, e.g., $V_{cc}$, is applied to the input leads 12 and 21 of FIGS. 1 and 2, a control signal A on the control lead 24 is a high level representing state I. When a low level voltage, e.g., $V_{ss}$, is applied to the input leads 12 and 21, the complementary control signal $\overline{A}$ on the complementary control lead 22 is a high level representing state II. Thus the resulting state I or II is a function of the state of the signal that is applied to the input leads 12 and 21.

Referring now to FIG. 3, there is a truth table that presents the operating conditions with state I represented on the top line and state II on the bottom line.

It is noted that the mode sensing circuit 15 can be configured as any type of digital or analog logic block, and the control signals on the control leads 22 and 24 can be a function of more than one input signal.

FIG. 4 presents the exemplary output driver circuit 20-1, which includes two tri-statable inverter drivers 51 and 52, an inverter driver 55, and two n-channel MOS transistors 57 and 58. The inverter driver 55 can be a conventional inverter driver. The tri-statable inverter drivers 51, 52 are similar to conventional inverter drivers except that they can be enabled and disabled by the control signals A and $\overline{A}$, respectively. The n-channel MOS transistors 57 and 58 include current paths that are connected in a series circuit between the lead 21 and ground voltage $V_{ss}$. Outputs of the tri-statable inverter drivers 51 and 52 are both applied in common to the control gate of the n-channel transistor 57. The output of the inverter driver 55 is applied to the control gate of the n-channel transistor 58.

The complementary control signals A and $\overline{A}$ from the circuit 15 of FIGS. 1 and 2 are applied over the control leads 24 and 22, respectively, to enable and disable the tri-statable inverter drivers 51 and 52. Since the control signals are complementary, the tri-statable inverters are enabled alternatively. These control signals partly determine whether the interface circuit system operates in state I or state II. The state of operation is further controlled by the input signal which is applied through the input terminal 12 and the lead 21 of FIG. 1 to the output driver circuit 20-1 of FIGS. 1 and 4.

FIG. 5 presents a truth table that represents the operation of the output driver circuit 20-1 in both state I and state II. State I is presented in the top two lines of FIG. 5. State II is presented in the bottom two lines of FIG. 5.

In state I, the output driver circuit 20-1 drives an output signal DQ-1 on the lead 35-1 to either a logic "1" or "0". State I is produced by applying the voltage $V_{cc}$ as the input signal on the input terminal 12 and the control lead 21. In state I, the control signal A on control lead 24 of FIGS. 2 3 and 4 is a logic "1", and the complementary control signal $\overline{A}$ on the complementary control lead 22 is a "0". Tri-statable inverter circuit 51 is enabled, and tri-statable inverter 52 is disabled.

When the input data signal DATA is a "1" during state I operation, the output signal DQ-1 on the lead 35-1 also is a "1". Conversely, when the input data signal DATA is a "0" during state I operation, the output signal DQ-1 is a "0". Thus in state I, the output driver produces an output signal state that depends upon the state of the applied input data signal DATA.

In state II, the output driver circuit 20-1 operates differently than in state I. State II is produced by applying the ground voltage $V_{ss}$ as the input signal on the input terminal 12 and the control lead 21. In state II, the control signal A on the control lead 24 of FIGS. 2, 3 and 4 is a logic "0", and the complementary control signal $\overline{A}$ on the complementary control lead 22 is a "1". Tri-statable inverter circuit 51 is disabled, and tri-statable inverter circuit 52 is enabled.

When the input data signal DATA is a "1" during state II operation, the output signal DQ-1 on the output lead 35-1 depends upon the configuration of the output circuit 34-1 connected to the output lead 35-1. When the input data signal DATA is a "1", the signals applied to the gate electrodes of the n-channel MOS transistors 57 and 58 are both low and those transistors 57 and 58 are off. Since those transistors 57 and 58 are off when the input data signal DATA is a "1" the output lead 35-1 goes to a state determined by the configuration of the output circuit 34-1 of FIG. 1. The type of output circuit to be connected to the output lead 35-1 of FIG. 4 can be selected by the user of the integrated circuit device.

When the input data signal DATA is a "0" during state II operation, the control gates of the n-channel MOS transistors 57 and 58 are at the high voltage level turning both of those transistors on. The output signal DQ-1 on the output lead 35-1 is "0".

Thus for state II operation, the output driver 20-1 produces an output signal state that depends upon the state of the applied input data signal DATA and the configuration of the connected output circuit 34-1 of FIG. 4.

The control lead 28, shown in FIG. 1, has been omitted from the schematic of FIG. 4 to simplify the latter. That control lead 28 and a control gate can be added into the circuit of FIG. 4 for enabling and disabling operation of the output driver 20-1.

Referring once again to FIG. 1 and additionally to FIG. 6, there is also shown an internal reference voltage generator 70. This voltage generator 70 contains a reference voltage generation logic circuit 72 and a reference voltage selection latch circuit 74. The purpose of the voltage generator 70 is to generate a reference voltage level either $V_{il}$ or $V_{ih}$ for a group of differential level converter/driver circuits 80-1 through 80-N, shown in FIG. 1. As an example, driver circuit 80-1 uses the selected reference voltage as a switching level to determine whether or not to change the logic state of internal control signals produced on lead 85-1. Others of the level converter/driver circuits similarly respond to the selected reference voltage level $V_{il}$ or $V_{ih}$ to determine the signal on their output leads, such as the lead 85-N. Address or control signals are applied by way of leads 90-1 through 90-N. If the address control signal voltage on the lead 90-1 falls below or rises above the selected reference voltage level, the converter circuit 80-1 senses this and changes the state of the signal on the output lead 85-1 accordingly. The internal function of block 80-1 is not pertinent to this discussion, since it could be an analog or a digital differential stage which reads input signals and modifies the output signal level according to a predetermined reference voltage level.

FIG. 7 presents a truth table for the operation of the differential level converter circuit 80-1 of FIG. 1.

Referring again to FIG. 6 and also to FIG. 8, the operation of internal reference voltage generator 70 is as follows. If the state I is enabled, the reference voltage generation logic 72 is turned on, and the reference voltage selection latch 74 is turned off. The logic circuit 72 internally determines the appropriate voltage and produces the desired reference voltage level $V_{il}$ or $V_{ih}$ on a lead 95. The internal function of block 72 can be performed by a combination of analog or digital circuitry, which is capable of producing the desired reference voltage, e.g., $V_{il}$. Conversely, if state II is enabled, the reference voltage generation logic 72 is turned off, and the reference voltage selection latch 74 is turned on. In this case the enabling of the selection latch 74 simply passes the state of the external reference voltage $V_{ref}$ to the lead 95 as the selected reference voltage $V_{ih}$. The selection latch 74 can be a combination of analog or digital circuitry, which is capable of passing the state of one signal to another circuit.

Other possible implementations of the internal reference voltage generator 70 could include multiple circuits, like the reference voltage generator 72, which internally produce multiple reference voltages based on multiple input mode signals. In this case a circuit similar to the reference voltage selection latch 74 would not have to be used. Also, multiple circuits like the selection latch 74 can be used with multiple input mode signals to latch in multiple reference voltage levels. Here, a circuit similar to the reference voltage generation logic 72 would not have to be used. Of course, these are only some of the possible examples, and other implementations are possible.

It is again noted that the described system of interface circuits can be used as the interface for any integrated circuit in a digital system environment. Some examples are interface circuits for main memory, for a memory controller, for cache memory, for a processor, and for peripherals.

A description of an illustrative embodiment of the invention has been presented. The described embodiment together with other embodiments made obvious in view thereof are considered to be within the scope of the following appended claims.

What is claimed is:

1. An interface circuit comprising:

a mode sensing circuit having an input terminal and first and second output terminals for producing control signals in response to an input signal, applied to the input terminal;

a first output circuit, responsive to the control signals, to first data signal and to first and second states of the input signal, for producing a first output data signal dependent upon the first data signal when the input signal is in the first state and for producing the first output data signal dependent upon the first data signal and a circuit connected to the first output circuit when the input signal is in the second state; and a second output circuit, responsive to the control signals, to a second data signal, and to the first and second states of the input signal, for producing a second output data signal dependent upon the second data signal when the input signal is in the first state and for producing the second output data signal dependent upon the second data signal and a circuit connected to the second output circuit when the input signal is in the second state.

2. An interface circuit comprising:

a mode sensing circuit having an input terminal and first and second output terminals for producing control signals in response to an input signal, applied to the input terminal;

a first output circuit, responsive to the control signals, to a first data signal and to first and second states of the input signal, for producing a first output data signal dependent upon the first data signal when the input signal is in the first state and for producing the first output data signal dependent upon the first data signal and a circuit connected to the first output circuit when the input signal is in the second state, wherein the first output circuit comprises:

first and second transistors having conducting paths connected in a series circuit between the input signal and ground, each of the first and second transistors having a control gate;

first and second tri-statable inverters, each having an input terminal connected to one of a complementary pair of leads for the first data signal, an output terminal connected in common to the control gate of the first transistor, and a control terminal for connection to leads carrying opposite ones of the first and second states of the input signal; and a circuit for inverting the first data signal and applying it to a control gate of the second transistor which is connected to ground.

* * * * *